(12) United States Patent
Isobe (10) Patent No.: US 11,397,224 B2
(45) Date of Patent: Jul. 26, 2022

(54) MAGNETIC SENSOR

(71) Applicant: KABUSHIKI KAISHA TOKAI RIKA DENKI SEISAKUSHO, Aichi (JP)

(72) Inventor: Naoki Isobe, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 11 days.

(21) Appl. No.: 16/967,073

(22) PCT Filed: Feb. 27, 2019

(86) PCT No.: PCT/JP2019/007613
§ 371 (c)(1),
(2) Date: Aug. 3, 2020

(87) PCT Pub. No.: WO2019/181408
PCT Pub. Date: Sep. 26, 2019

(65) Prior Publication Data
US 2021/0033684 A1 Feb. 4, 2021

(30) Foreign Application Priority Data

Mar. 22, 2018 (JP) .............................. JP2018-054391

(51) Int. Cl.
*G01R 33/09* (2006.01)
*G01B 7/30* (2006.01)
*G01D 5/16* (2006.01)

(52) U.S. Cl.
CPC ............... *G01R 33/09* (2013.01); *G01B 7/30* (2013.01); *G01D 5/16* (2013.01)

(58) Field of Classification Search
CPC ............ G01R 33/09; G01B 7/30; G01D 5/16
See application file for complete search history.

(56) References Cited

U.S. PATENT DOCUMENTS

| 6,064,197 A | 5/2000 | Lochmann et al. |
| 6,169,396 B1 * | 1/2001 | Yokotani ............... G01D 5/147 324/207.12 |

(Continued)

FOREIGN PATENT DOCUMENTS

| JP | 11-094512 A | 4/1999 |
| JP | 2008-101954 A | 5/2008 |

*Primary Examiner* — Reena Aurora
(74) *Attorney, Agent, or Firm* — Roberts Calderon Safran & Cole P.C.

(57) ABSTRACT

A magnetic sensor includes a radial magnetoresistance element including plural magnetic sensing parts arranged radially from one point, an annular or polygonal magnetoresistance element arranged so as to surround the radial magnetoresistance elements, and at least one half-bridge circuit including the radial magnetoresistance element and the annular or polygonal magnetoresistance element. The radial magnetoresistance element may include a first magnetoresistance element including plural first magnetic sensing parts and a second magnetoresistance element including plural second magnetic sensing parts. The annular or polygonal magnetoresistance element may include an annular or polygonal third magnetoresistance element surrounding the first and second magnetoresistance elements and an annular or polygonal fourth magnetoresistance element surrounding the third magnetoresistance element. Two half-bridge circuits including the first to fourth magnetoresistance elements may be installed in the magnetic sensor.

10 Claims, 7 Drawing Sheets

(56) References Cited

U.S. PATENT DOCUMENTS

| | | | | |
|---|---|---|---|---|
| 8,451,003 B2* | 5/2013 | Yamazaki | ............... | G01D 5/145 |
| | | | | 324/252 |
| 10,365,123 B2* | 7/2019 | Lee | ......................... | G01D 5/145 |

* cited by examiner

MAGNETIC SENSOR

CROSS-REFERENCE TO RELATED APPLICATIONS

The present application is a U.S. National Phase of PCT/JP2019/007613 filed on Feb. 27, 2019 claiming priority to Japanese Patent Application No. 2018-054391 filed on Mar. 22, 2018. The disclosure of the PCT Application is hereby incorporated by reference into the present Application.

TECHNICAL FIELD

The present invention relates to a magnetic sensor.

BACKGROUND ART

Angle sensors are known which are provided with a magnetic field sensor element constructed from a MR (Magneto Resistive) sensor in which plural magnetoresistance elements are connected so as to form one or more measuring bridges (see e.g. Patent Literature 1).

The angle sensors can detect an angular position of a measurement target rotating about the rotation axis by detecting a direction of a magnetic vector of a magnetic field.

CITATION LIST

Patent Literature

Patent Literature 1: JP H11/94512 A

SUMMARY OF INVENTION

Technical Problem

A magnetic sensor using the MR sensor is known which determines several states base on the detected angles. The magnetic sensor, when a disturbance magnetic field is applied, may have a difficulty to discriminate whether the detected angle of the magnetic vector is an angle of a magnetic vector of a magnet or an angle of a magnetic vector of the disturbance magnetic field, causing an erroneous determination.

It is an object of the invention to provide a magnetic sensor which is proof against a disturbance magnetic field.

Solution to Problem

According to an embodiment of the invention, a magnetic sensor comprises a radial magnetoresistance element comprising a plurality of magnetic sensing parts arranged radially from one point, an annular or polygonal magnetoresistance element arranged so as to surround the radial magnetoresistance elements, and at least one half-bridge circuit comprising the radial magnetoresistance element and the annular or polygonal magnetoresistance element.

Advantageous Effects of Invention

According to an embodiment of the invention, it is possible to provide a magnetic sensor which is proof against a disturbance magnetic field.

DESCRIPTION OF EMBODIMENTS

Summary of Embodiments

A magnetic sensor of embodiments comprises a magnetic sensor comprises a radial magnetoresistance element comprising a plurality of magnetic sensing parts arranged radially from one point, an annular or polygonal magnetoresistance element arranged so as to surround the radial magnetoresistance elements, and at least one half-bridge circuit comprising the radial magnetoresistance element and the annular or polygonal magnetoresistance element.

Since how the magnetoresistance value changes with respect to a direction of a magnetic field is different between the radial magnetoresistance element and the annular or polygonal magnetoresistance element, the magnetic sensor can easily discriminate between the action of the magnetic field due to a detection target and the action of the disturbance magnetic field and thus can be proof against the disturbance magnetic field, unlike when each magnetoresistance element is arranged in a rotationally symmetric manner.

First Embodiment

General Configuration of Magnetic Sensor 1

Figure 1A:
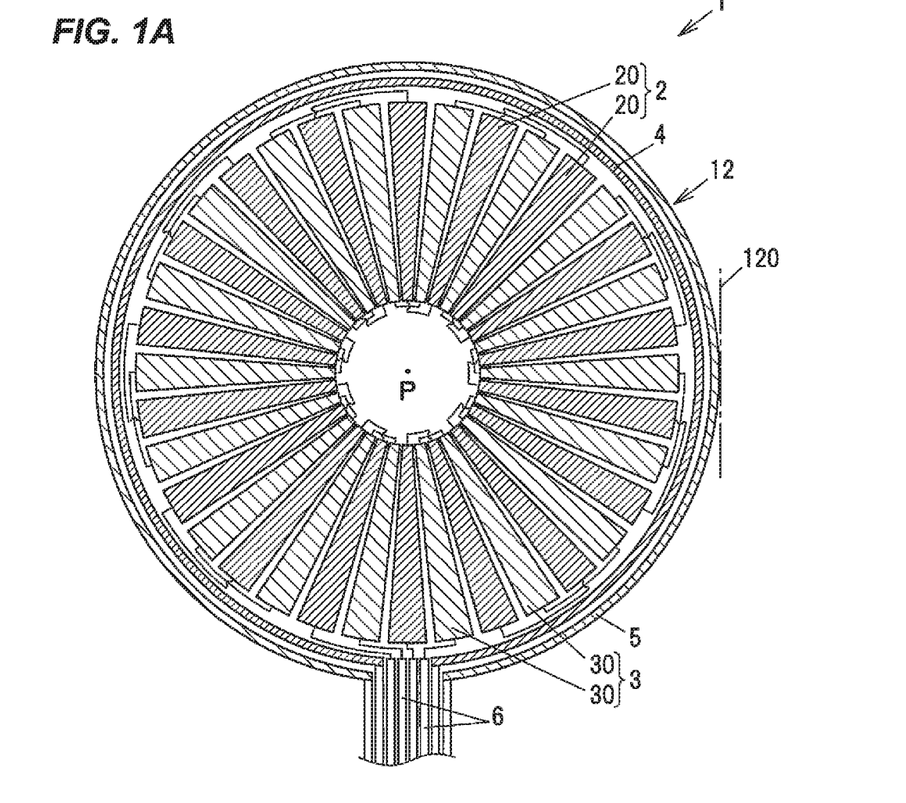
FIG. 1A is an explanatory diagram illustrating an arrangement of first to fourth magnetoresistance elements of a magnetic sensor in the first embodiment.
Figure 1B:
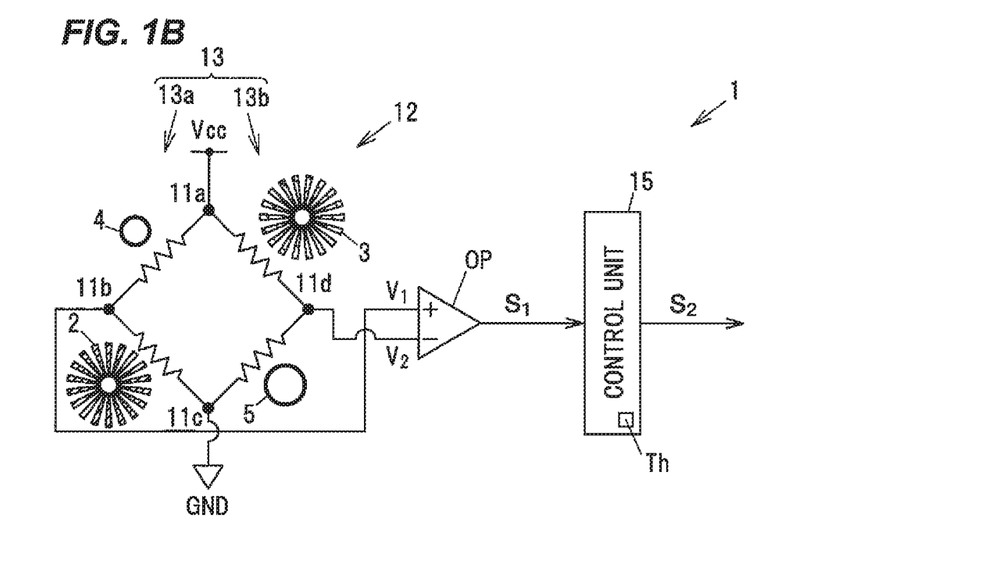
FIG. 1B is an equivalent circuit diagram illustrating the magnetic sensor in the first embodiment.
Figure 2A:
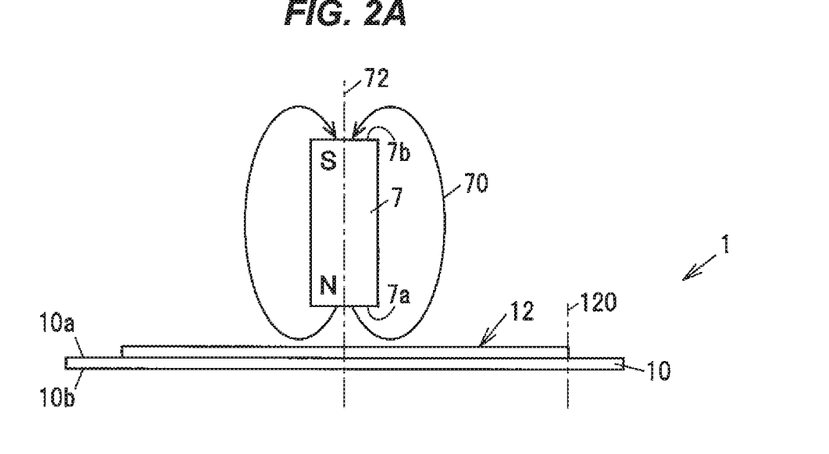
FIG. 2A is an explanatory diagram for explaining a positional relation between the magnetic sensor in the first embodiment and a magnet.
Figure 2B:
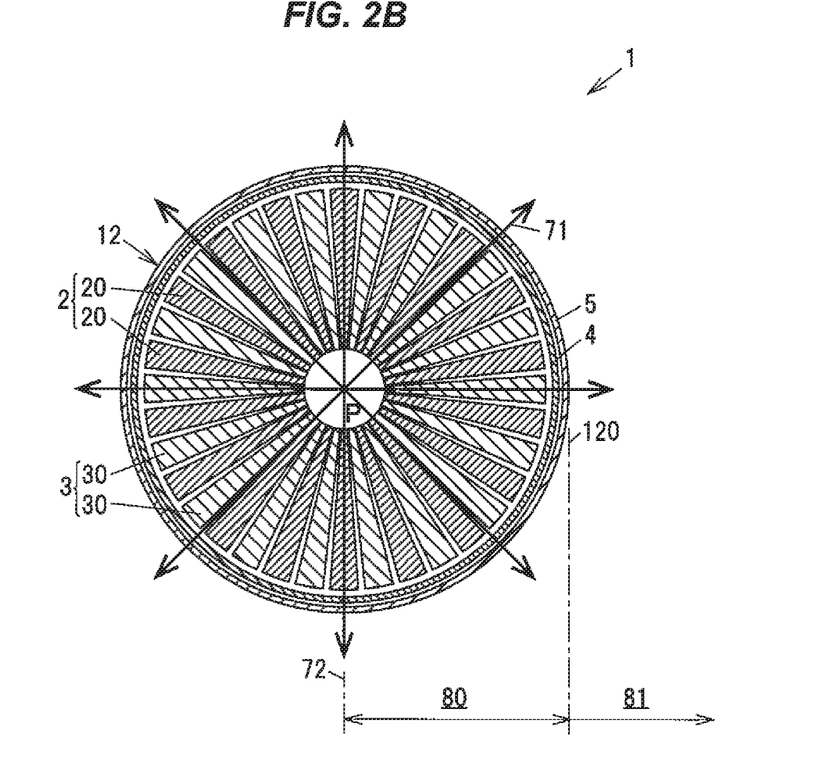
FIG. 2B is an explanatory diagram for explaining a magnetic vector acting on the magnetic sensor in the first embodiment.

FIG. 1A is an explanatory diagram illustrating an arrangement of first to fourth magnetoresistance elements of a magnetic sensor in the first embodiment, and FIG. 1B is an equivalent circuit diagram illustrating the magnetic sensor in the first embodiment. FIG. 2A is an explanatory diagram for explaining a positional relation between the magnetic sensor in the first embodiment and a magnet, and FIG. 2B is an explanatory diagram for explaining a magnetic vector acting on the magnetic sensor in the first embodiment. In each drawing of the embodiment described below, a scale ratio may be different from an actual ratio. In addition, in FIG. 1B, flows of main signal and information are indicated by arrows. Furthermore, wirings 6 are omitted in FIGS. 2B, 3B and 4A.

A magnetic sensor 1 detects, e.g., approach or separation of a magnet 7 to/from the magnetic sensor 1. As an example, the magnetic sensor 1 is used in a non-contact switch which detects ON and OFF, or in a device which detects two states such as an operation device detecting whether or not an operation is performed on an operation part. The magnetic sensor 1 in the first embodiment is used in a non-contact switch which determines approach of the magnet 7 as ON and separation as OFF, as an example.

The magnetic sensor 1 has, e.g., a radial magnetoresistance element having plural magnetic sensing parts arranged radially from one point (a center P), an annular or polygonal magnetoresistance element arranged so as to surround the radial magnetoresistance element, and at least one half-bridge circuit constructed from the radial magnetoresistance element and the annular or polygonal magnetoresistance element, as shown in FIGS. 1A and 1B.

A first magnetoresistance element 2 having plural first magnetic sensing parts 20 and a second magnetoresistance element 3 having plural second magnetic sensing parts 30 are provided as the radial magnetoresistance elements in the first embodiment. Also, an annular third magnetoresistance element 4 surrounding the first magnetoresistance element 2 as well as the second magnetoresistance element 3 and an annular fourth magnetoresistance element 5 surrounding the third magnetoresistance element 4 are provided as the annular or polygonal magnetoresistance elements in the first embodiment. The the magnetic sensor 1 is provided with, e.g., two half-bridge circuits 13a and 13b constructed from the first to fourth magnetoresistance elements 2 to 5, as shown in FIG. 1B.

In the first embodiment, the third magnetoresistance element 4 and the fourth magnetoresistance element 5 are formed as the annular magnetoresistance elements, as an example.

The first magnetic sensing parts 20 and the second magnetic sensing parts 30 have, e.g., magnetoresistance values which change depending on a magnetic vector 71 of a magnetic field 70 generated by the magnet 7, as shown in FIGS. 2A and 2B. The first magnetic sensing parts 20 and the second magnetic sensing parts 30 have, e.g., a circular-sector shape obtained by dividing a circle centered at the center P, as shown in FIG. 1A.

In addition, the magnetic sensing parts 20 and the second magnetic sensing parts 30 are arranged, e.g., alternately in a circumferential direction, as shown in FIG. 1A. When the first magnetoresistance element 2 and the second magnetoresistance element 3 are configured to have the same resistance value including the magnetoresistance value, however, the shape, number and circumferential arrangement order, etc., of the magnetic sensing parts are not limited as long as the resistance values are the same.

In addition, the shape and number, etc., of the magnetic sensing parts may be selected so that the resistance values of the first magnetoresistance element 2 and the second magnetoresistance element 3 are coordinated with the resistance values of the third magnetoresistance element 4 and the fourth magnetoresistance element 5, i.e., coincide with the resistance values of the annular magnetoresistance elements with which the first magnetoresistance element 2 and the second magnetoresistance element 3 constitute the half-bridge circuits.

In the third magnetoresistance element 4 and the fourth magnetoresistance element 5, the magnetic sensing parts have a ring shape (an annular shape) and the magnetoresistance values change depending on the direction of the magnetic vector 71.

The magnetic sensor 1 is configured that the first magnetoresistance element 2 or the second magnetoresistance element 3 and the third magnetoresistance element 4 or the fourth magnetoresistance element 5 are electrically connected and output a first midpoint potential, and the remaining magnetoresistance elements are electrically connected and output a second midpoint potential. This magnetic sensor 1 is provided with a bridge circuit 13 composed of the half-bridge circuit 13a and the half-bridge circuit 13b.

In detail, the half-bridge circuit 13a is formed by electrically connecting, e.g., the first magnetoresistance element 2 to the third magnetoresistance element 4 and outputs midpoint potential $V_1$ as the first midpoint potential, as shown in FIG. 1B. Also, the half-bridge circuit 13a is formed by electrically connecting, e.g., the second magnetoresistance element 3 to the fourth magnetoresistance element 5 and outputs midpoint potential $V_2$ as the second midpoint potential.

In the bridge circuit 13, the combination to form the half-bridge circuit may be other combinations as long as, e.g., the radial magnetoresistance element is connected to the annular magnetoresistance element. Therefore, the half-bridge circuits may be, e.g., the half-bridge circuit 13a formed by electrically connecting the first magnetoresistance element 2 to the fourth magnetoresistance element 5 and the half-bridge circuit 13b formed by electrically connecting the second magnetoresistance element 3 to the third magnetoresistance element 4.

The magnetic sensor 1 also has, e.g., an op-amp OP and a control unit 15, as shown in FIG. 1B. The first to fourth magnetoresistance elements 2 to 5 are formed on, e.g., a substrate 10, as shown in FIG. 2B. The substrate 10 is, e.g., a printed circuit board on which the op-amp OP and the control unit 15 may be arranged in addition to a sensor part 12 formed of the first to fourth magnetoresistance elements 2 to 5.

Configuration of First to Fourth Magnetoresistance Elements 2 to 5

The first magnetoresistance element 2 and the second magnetoresistance element 3 are configured that the first magnetic sensing parts 20 and the second magnetic sensing parts 30 have the same shape as the example shown in FIG. 1A. Also, the third magnetoresistance element 4 and the fourth magnetoresistance element 5 are configured that magnetic sensing parts thereof have an annular shape but are different in at least a radius.

The first to fourth magnetoresistance elements 2 to 5 are formed as, e.g., thin alloy films consisting mainly of a ferromagnetic metal such a Ni or Fe. The first magnetic sensing parts 20 are arranged in such a manner that, e.g., end portions are alternately connected so as to be connected in series by a metal material such as copper of which resistance value does not change with the change in the direction of the magnetic vector 71, and a start point and an end point of the series connection are connected to the wirings 6, as shown in FIG. 1A. Likewise, the second magnetic sensing parts 30 are arranged in such a manner that, e.g., end portions are alternately connected so as to be connected in series, and a start point and an end point of the series connection are connected to the wirings 6, as shown in FIG. 1A. Thus, the current in the first magnetic sensing parts 20 and the second magnetic sensing parts 30 flows in a radial direction.

The wirings connecting these magnetic sensing parts are formed on a front surface 10a and a back surface 10b of the substrate 10, and the wirings on the front surface 10a and the back surface 10b are electrically connected via a though-hole which penetrates the substrate 10, as an example. The wirings connecting the magnetic sensing parts may be three-dimensionally formed on the front surface 10a so as to sandwich an insulation therebetween.

Also, the third magnetoresistance element 4 and the fourth magnetoresistance element 5 are, e.g., partially cut out and are electrically connected to the wirings 6, as shown in FIG. 1A. The wiring 6 is formed of a metal material such as copper of which resistance value does not change with the change in the direction of the magnetic vector 71. Thus, the current in the third magnetoresistance element 4 and the fourth magnetoresistance element 5 flows in a circumferential direction.

As an example, the first magnetic sensing parts 20 and the second magnetic sensing parts 30 are circular sector-shaped magnetic sensing parts which have the same shape and are arranged at equal intervals with a rotation by 10° about the center P. In other words, the first magnetic sensing parts 20 and the second magnetic sensing parts 30 are arranged rotationally symmetrically about the center P.

The first to fourth magnetoresistance elements 2 to 5 constitute the bridge circuit 13 and thus preferably have equal resistance values including magnetoresistance values when not under the action of the magnetic vector 71. In other words, the first to fourth magnetoresistance elements 2 to 5 preferably have equal resistance values including resistance components which do not change even under the action of the magnetic vector 71 and magnetoresistance components which change under the action of the magnetic vector 71. When the magnetic sensor 1 has such a configuration and the magnet 7 is located directly above the sensor part 12, the midpoint potential $V_1$ and the midpoint potential $V_2$ become equal to each other and an output signal $S_1$ becomes zero.

Therefore, the first magnetoresistance element 2 and the second magnetoresistance element 3 are formed so that the same numbers of the first magnetic sensing parts 20 and the second magnetic sensing parts 30 having the same area are formed of the same material.

The third magnetoresistance element 4 and the fourth magnetoresistance element 5 also preferably have equal resistance values. However, the third magnetoresistance element 4 and the fourth magnetoresistance element 5 have different radii and thus have different shapes. Therefore, it is preferable to adjust widths, lengths and materials, etc., so that their resistance values become equal. For the first to fourth magnetoresistance elements 2 to 5 in the first embodiment, the materials, etc., are selected so that their resistance values become equal.

As a modification, the magnetic sensor 1 may be configured so that at least the resistance values of the radial magnetoresistance element and the annular magnetoresistance element constituting the half-bridge circuit are equal. In detail, for example, the resistance values of the first magnetoresistance element 2 and the third magnetoresistance element 4 constituting the half-bridge circuit 13a are equal, and the resistance values of the second magnetoresistance element 3 and the fourth magnetoresistance element 5 constituting the half-bridge circuit 13b are equal.

As another modification, the magnetic sensor 1 may have, e.g., a configuration in which a difference between midpoint potentials due to a difference between the resistance values of the first to fourth magnetoresistance elements 2 to 5 is offset when the magnet 7 is located directly above the sensor part 12, or a configuration in which ON or OFF is determined by adjusting a threshold value Th.

A node 11a as a connecting point between the second magnetoresistance element 3 and the third magnetoresistance element 4 is electrically connected to a power source voltage $V_{cc}$, as shown in FIG. 1B. A node 11c as a connecting point between the first magnetoresistance element 2 and the fourth magnetoresistance element 5 is electrically connected to GND.

The midpoint potential $V_1$ at a node 11b between the third magnetoresistance element 4 and the first magnetoresistance element 2 is output from the half-bridge circuit 13a, as described above. The midpoint potential $V_1$ is input to anon-inverting (+side) input terminal of the op-amp OP.

The midpoint potential $V_2$ at a node 11d between the second magnetoresistance element 3 and the fourth magnetoresistance element 5 is output from the half-bridge circuit 13b, as described above. The midpoint potential $V_2$ is input to an inverting (−side) input terminal of the op-amp OP. The op-amp OP outputs the output signal $S_1$, which is obtained by differentially amplifying the midpoint potential $V_1$ input to the non-inverting input terminal and the midpoint potential $V_2$ input to the inverting input terminal, to the control unit 15.

Configuration of the Magnet 7

The magnet 7 has, e.g., a pillar shape, such as column or quadrangular prism, which generates the radial magnetic vector 71, as shown in FIGS. 2A and 2B. The magnet 7 in the first embodiment has, e.g., a columnar shape.

The magnet 7 is magnetized to have, e.g., an N-pole on the first to fourth magnetoresistance elements 2 to 5 side and an S-pole on the other side, as shown in FIG. 2A. The magnet 7 generates, e.g., the radial magnetic field 70 toward the substrate 10 so that the radial magnetic vector 71 acts on the first to fourth magnetoresistance elements 2 to 5, as shown in FIG. 2B. The magnetic poles of the magnet 7 may be located the other way round.

The magnet 7 is obtained by, e.g., shaping a permanent magnet such as alnico magnet, ferrite magnet or neodymium magnet into a desired shape, or by mixing a magnetic material based on ferrite, neodymium, samarium-cobalt or samarium-iron-nitrogen, etc., with a synthetic resin material and shaping into a desired shape. The magnet 7 in the first embodiment is a permanent magnet, as an example. Alternatively, the magnet 7 may be an electromagnet.

As an example, the magnet 7 in the first embodiment moves from a position at which a center line 72 shown in FIG. 2A coincides with the center P of the magnetic sensor 1, to outside a boundary 120 of the magnetic sensor 1. The center line 72 is, e.g., a line which connects the centers of an end face 7a on the N-pole side and an end face 7b on the S-pole side and is extended. Also, the boundary 120 is, e.g., an outer periphery of the sensor part 12, i.e., an outer periphery of the fourth magnetoresistance element 5.

The control unit 15 is configured to determine it is ON when the center line 72 of the magnet 7 is located in an ON region 80, and to determine it is OFF when located in an OFF region 81, where, e.g., a region from the center P to the boundary 120 is defined as the ON region 80 and a region outside the boundary 120 is defined as the OFF region 81.

Configuration of the Control Unit 15

Figure 3A:
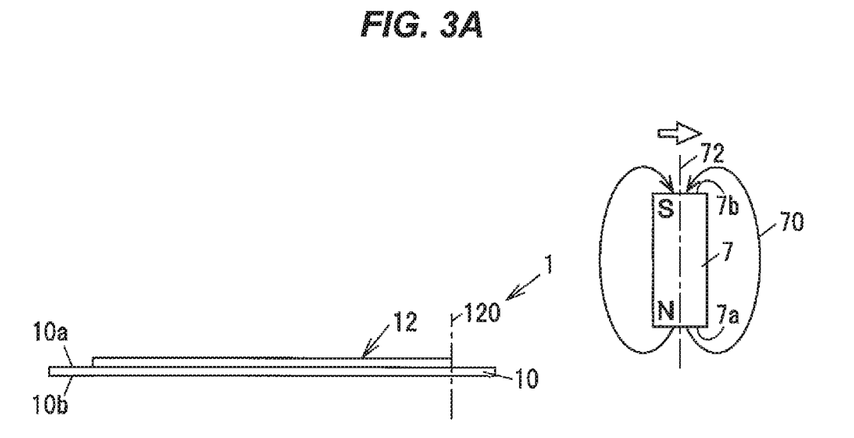
FIG. 3A is an explanatory diagram illustrating the magnet located at a distance from the magnetic sensor in the first embodiment.
Figure 3B:
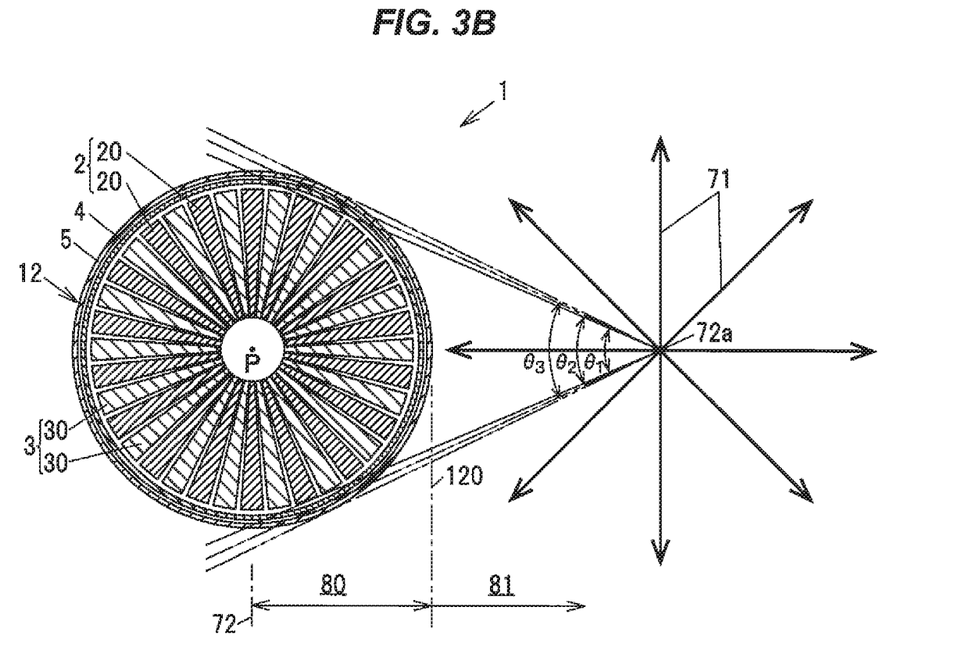
FIG. 3B is an explanatory diagram illustrating a magnetic vector of the magnet located at a distance from the magnetic sensor in the first embodiment.
Figure 4A:
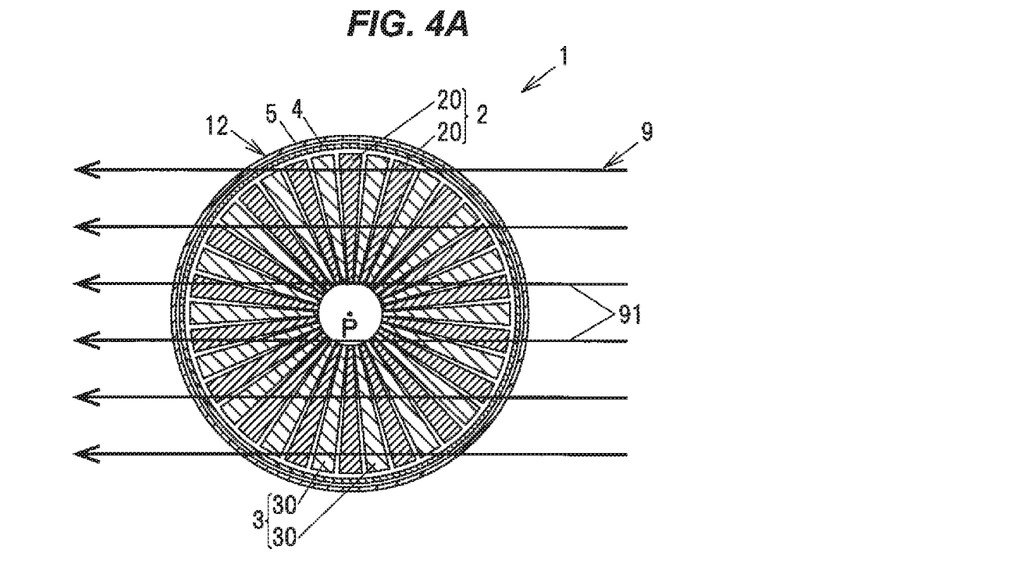
FIG. 4A is an explanatory diagram illustrating a disturbance magnetic field acting on the magnetic sensor in the first embodiment.
Figure 4B:
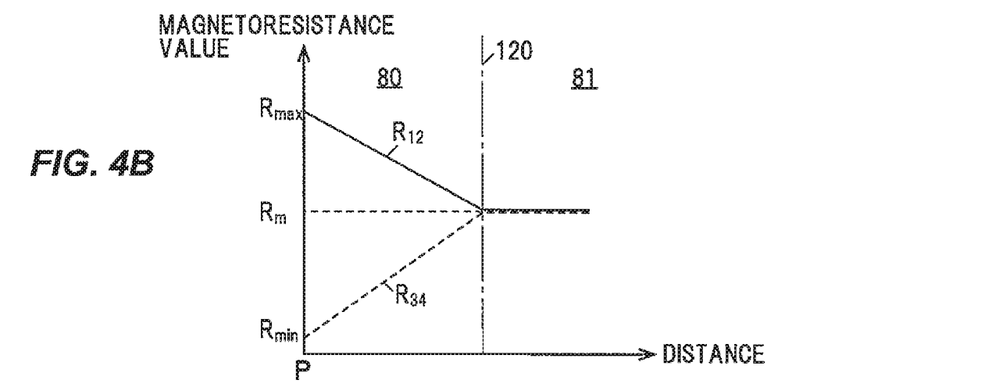
FIG. 4B is a graph showing a relation between a magnetoresistance value of the magnetic sensor in the first embodiment and a distance from the center.
Figure 4C:
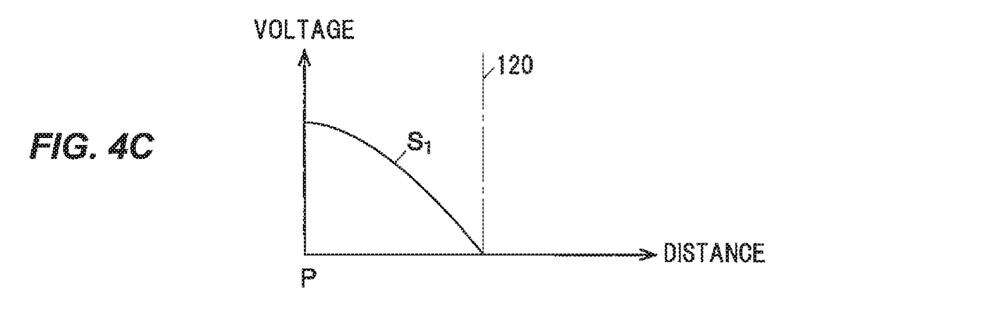
FIG. 4C is a graph showing an output signal output from an op-amp of the magnetic sensor in the first embodiment.

FIG. 3A is an explanatory diagram illustrating the magnet located at a distance from the magnetic sensor in the first embodiment, and FIG. 3B is an explanatory diagram illustrating a magnetic vector of the magnet located at a distance from the magnetic sensor in the first embodiment. FIG. 4A is an explanatory diagram illustrating a disturbance magnetic field acting on the magnetic sensor in the first embodiment, FIG. 4B is a graph showing a relation between a magnetoresistance value of the magnetic sensor in the first embodiment and a distance from the center, and FIG. 4C is an explanatory diagram illustrating an example of the output signal output from the magnetic sensor. In FIG. 4B, the vertical axis indicates the magnetoresistance value and the horizontal axis indicates a distance from the center P to the magnet 7. In FIG. 4C, the vertical axis indicates voltage and the horizontal axis indicates the distance from the center P to the magnet 7. The distance to the magnet 7 is a distance (the shortest distance) from the center P to the center line 72 of the magnet 7.

The control unit 15 is, e.g., a microcomputer composed of a CPU (Central Processing Unit) performing calculation and processing, etc., of the acquired data according to a stored program, and a RAM (Random Access Memory) and a ROM (Read Only Memory) which are semiconductor memories, etc. The ROM stores, e.g., a program for operation of the control unit 15, and the threshold value Th. The RAM is used as, e.g., a storage area for temporarily storing calculation results, etc.

The control unit 15 compares, e.g., the output signal $S_1$ output from the op-amp OP with the threshold value Th and determines whether or not the magnet 7 approaches. The threshold value Th is set based on the output signal $S_1$, i.e., a voltage difference between the midpoint potential $V_1$ and the midpoint potential $V_2$ when the magnet 7 is located on the boundary 120. The magnet 7 located on the boundary 120 means that the center line 72 of the magnet 7 is located on the boundary 120.

The control unit 15 determines that the magnet 7 is located in the ON region 80 and it is thus ON when the voltage of the output signal $S_1$ is not less than the threshold value Th, and that the magnet 7 is located in the OFF region 81 and it is thus OFF when less than the threshold value Th. When determining that it is ON, the control unit 15 generates detection information $S_2$ indicating ON and outputs it to a connected electronic device.

When the magnet 7 is far enough away, magnetoresistance values $R_{12}$ of the first magnetoresistance element 2 and the second magnetoresistance element 3 and magnetoresistance values $R_{34}$ of the third magnetoresistance element 4 and the fourth magnetoresistance element 5 converge to substantially the same value, and the threshold value Th thus becomes a value close to zero.

The Case That the Center Line 72 of the Magnet 7 is Located in ON Region 80

When the magnet 7 is located directly above the center P of the magnetic sensor 1, i.e., when the center line 72 of the magnet 7 coincides with the center P of the sensor part 12 as shown in FIGS. 2A and 2B, the magnetic vector 71 radially extending from the center P acts on the sensor part 12.

As to the first magnetoresistance element 2 and the second magnetoresistance element 3, the magnetoresistance value $R_{12}$ does not change, i.e., remain at the maximum value $R_{max}$ since the magnetic vector 71 acts, e.g., parallelly on the first magnetic sensing parts 20 and the second magnetic sensing parts 30, as shown in FIGS. 2A, 2B and 4B. In other words, since the magnetic vector 71 acts parallelly on the current flowing through the first magnetoresistance element 2 and the second magnetoresistance element 3, the magnetoresistance values $R_{12}$ do not change.

Meanwhile, the magnetoresistance values $R_{12}$ are the magnetoresistance values represented by a solid line in FIG. 4B which is shown as an example and indicates both the magnetoresistance values of the first magnetoresistance element 2 and the second magnetoresistance element 3 to depict that the magnetoresistance values are equal.

As to the third magnetoresistance element 4 and the fourth magnetoresistance element 5, the magnetoresistance value $R_{34}$ become the minimum value $R_{min}$, since the magnetic vector 71 acts, e.g., perpendicularly, as shown in FIGS. 2A, 2B and 4B. In other words, since the magnetic vector 71 acts perpendicularly on the current flowing through the third magnetoresistance element 4 and the fourth magnetoresistance element 5, the magnetoresistance values $R_{34}$ become the minimum.

Meanwhile, the magnetoresistance values $R_{34}$ are the magnetoresistance values represented by a thick dotted line in FIG. 4B which is shown as an example and indicates both the magnetoresistance values of the third magnetoresistance element 4 and the fourth magnetoresistance element 5 to depict that the magnetoresistance values are equal.

Thus, the midpoint potential $V_1$ becomes the maximum and the midpoint potential $V_2$ becomes the minimum. Therefore, the output signal $S_1$ output from the op-amp OP becomes the maximum value, as shown in, e.g., FIG. 4C. That is, when the magnet 7 is located on the center P, the output signal $S_1$ becomes the maximum.

Then, when the magnet 7 moves from the center P toward the boundary 120, the magnetoresistance value $R_{12}$ and the magnetoresistance value $R_{34}$ of the first to fourth magnetoresistance elements 2 to 5 increase and decrease toward, e.g., a resistance value $R_m$, as shown in FIG. 4B. The control unit 15 compares, e.g., the output signal $S_1$, which is obtained by amplifying a difference between the midpoint potential $V_1$ and the midpoint potential $V_2$, with the threshold value Th and determines that the magnet 7 is located in the ON region 80 until the output signal $S_1$ becomes smaller than the threshold value Th, as shown in FIG. 4C.

The Case That the Center Line 72 of the Magnet 7 is Located in OFF Region 81

When the magnet 7 is located outside the magnetic sensor 1, i.e., when the center line 72 of the magnet 7 is located outside the boundary 120 as shown in FIGS. 3A and 3B, a portion of the magnetic vector 71 radially extending from a center 72a acts on the sensor part 12.

As to the first magnetoresistance element 2 and the second magnetoresistance element 3, the magnetic vector 71 within, e.g., an angle $\theta_1$ formed by two lines (solid lines in FIG. 3B) extending from the center 72a of the radial magnetic vector 71 and tangent to the first magnetic sensing parts 20 and the second magnetic sensing parts 30 acts thereon from outside the boundary 120, as shown in FIGS. 3A, 3B and 4B.

The magnetic vector 71 acts on the first magnetoresistance element 2 and the second magnetoresistance element 3, e.g., symmetrically with respect to the horizontal direction on the paper of FIG. 3B and also intersects with the current, causing a decrease from the maximum value $R_{max}$ and convergence. The magnetoresistance values $R_{12}$ converge to a value close to the resistance value $R_m$, as an example.

Also, as to the third magnetoresistance element 4, the magnetic vector 71 within, e.g., an angle $\theta_2$ formed by two lines (dashed-dotted lines in FIG. 3B) extending from the center 72a of the radial magnetic vector 71 and tangent to the third magnetoresistance element 4 acts thereon, as shown in FIGS. 3A, 3B and 4B.

Likewise, as to the fourth magnetoresistance element 5, the magnetic vector 71 within, e.g., an angle $\theta_3$ formed by two lines (dash-dot-dot lines in FIG. 3B) extending from the center 72a of the magnetic vector 71 and tangent to the fourth magnetoresistance element 5 acts thereon, as shown in FIGS. 3A, 3B and 4B. These angles satisfy $\theta_1 < \theta_2 < \theta_3$.

These magnetic vectors 71 act on the third magnetoresistance element 4 and the fourth magnetoresistance element 5, e.g., symmetrically with respect to the horizontal direction on the paper of FIG. 3B and intersects with the current at an angle off the perpendicular, causing an increase from the maximum value $R_{max}$ and convergence. The magnetoresistance values $R_{34}$ converge to a value close to the resistance value $R_m$, as an example.

When, for example, it is configured that the magnetoresistance values of the first to fourth magnetoresistance elements 2 to 5 converge to a value close to the resistance value $R_m$, the midpoint potential $V_1$ and the midpoint potential $V_2$ become a value closed to zero. Therefore, the output signal $S_1$ output from the op-amp OP becomes a value closed to zero. That is, when the magnet 7 is located outside the boundary 120, the output signal $S_1$ becomes a value closed to zero.

The Case That the Disturbance Magnetic Field 9 Acts Thereon

When a disturbance magnetic field 9 acts on the magnetic sensor 1, for example, magnetic vectors 90 in the same direction act on the first to fourth magnetoresistance elements 2 to 5, as shown in FIG. 4A.

In this case, the magnetoresistance values $R_{12}$ of the first magnetoresistance element 2 and the second magnetoresistance element 3 converge to a value close to the resistance value $R_m$, in the same manner as when the magnet 7 is located outside the boundary 120. The magnetoresistance values $R_{34}$ of the third magnetoresistance element 4 and the fourth magnetoresistance element 5 also converge to a value close to the resistance value $R_m$, in the same manner as when the magnet 7 is located outside the boundary 120.

Since the magnetoresistance values $R_{12}$ and the magnetoresistance values $R_{34}$ of the first to fourth magnetoresistance elements 2 to 5 converge to a value close to the resistance value $R_m$ in the same manner as when the magnet 7 is located outside the boundary 120, the output signal $S_1$ becomes a value close to zero.

The above-mentioned configuration allows the control unit 15 to detect ON and OFF by comparing the output signal $S_1$ with the threshold value Th. In addition, under the action of the disturbance magnetic field 9, the control unit 15 does not determine that the magnet 7 is located in the ON region 80. Therefore, it is possible to prevent such an erroneous determination that it is determined ON when the disturbance magnetic field 9 is applied.

Figure 5:
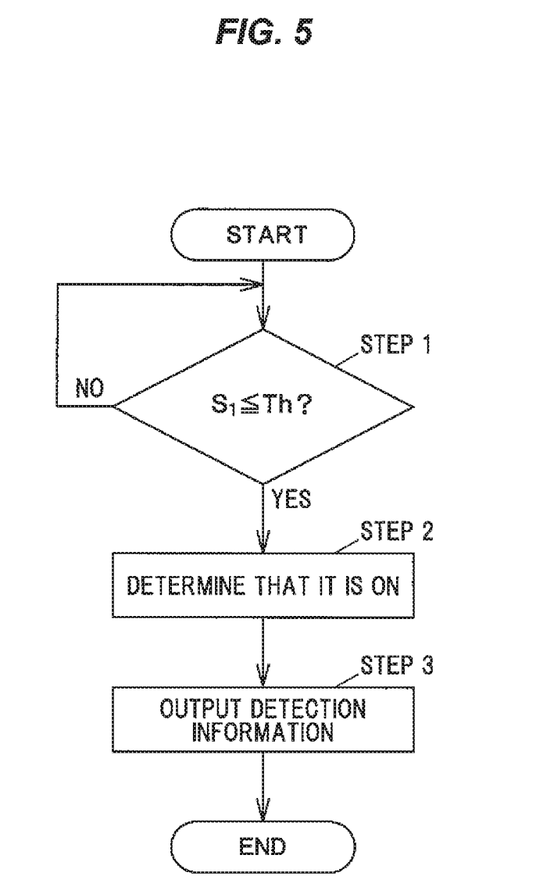
FIG. 5 is a flowchart showing an operation of the magnetic sensor in the first embodiment.

Next, an example of an operation of the magnetic sensor 1 in the first embodiment will be described below along with the flowchart in FIG. 5.

Operation

When the power is turned on, the control unit 15 of the magnetic sensor 1 monitors the output signal $S_1$. When it is "Yes" in Step 1, i.e., when the output signal $S_1$ is not less than threshold value Th (Step 1: Yes), the control unit 15 determines that the magnet 7 is located in the ON region 80, i.e., it is ON (Step 2).

Based on the determination result, the control unit 15 generates the detection information $S_2$ indicating determination of "ON" and outputs it to the connected electronic device (Step 3).

Effects of the First Embodiment

The magnetic sensor 1 in the first embodiment is proof against the disturbance magnetic field 9. In detail, since how the magnetoresistance value changes with respect to the direction of the magnetic field 70 is different between the radial magnetoresistance elements (the first magnetoresistance element 2 and the second magnetoresistance element 3) and the annular magnetoresistance elements (the third magnetoresistance element 4 and the fourth magnetoresistance element 5), the magnetic sensor 1 can easily discriminate between the action of the magnetic field 70 of the magnet 7 and the action of the disturbance magnetic field 9 and thus can be proof against the disturbance magnetic field 9, unlike when each magnetoresistance element is arranged in a rotationally symmetric manner.

Since the direction of the magnetic vector 71 which causes a change in the magnetoresistance value is different for the radial magnetoresistance elements and the annular magnetoresistance elements, the magnetic sensor 1 does not determine "ON" even when the disturbance magnetic field 9 acts. Therefore, unlike when such a configuration is not adopted, it is suitable for use in an environment in which the disturbance magnetic field 9 is likely to be generated, such as in vehicle.

Second Embodiment

The second embodiment is different from other embodiments in having one radial magnetoresistance element and one annular magnetoresistance element.

Figure 6A:
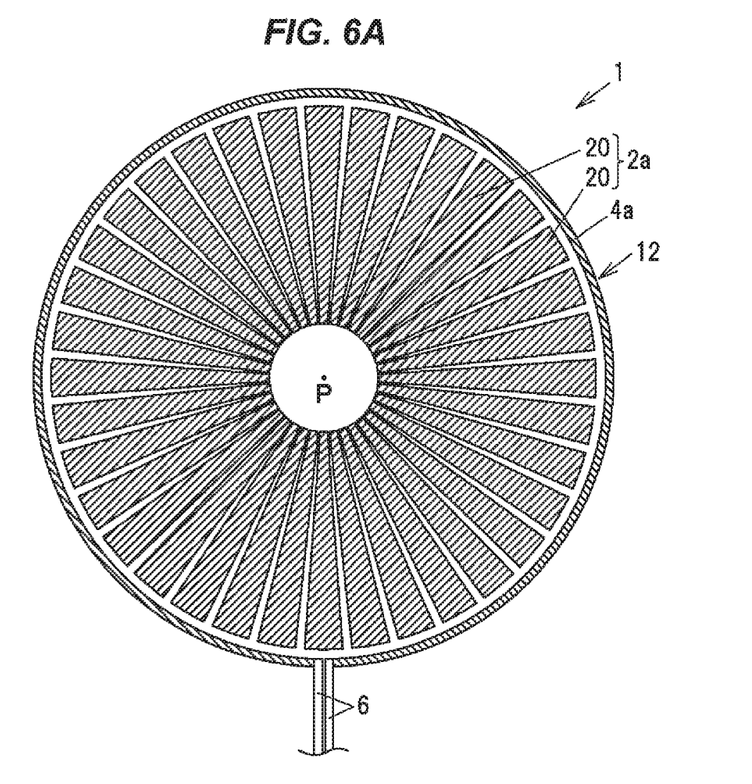
FIG. 6A is an explanatory diagram illustrating an arrangement of a radial magnetoresistance element and an annular magnetoresistance element of a magnetic sensor in the second embodiment.
Figure 6B:
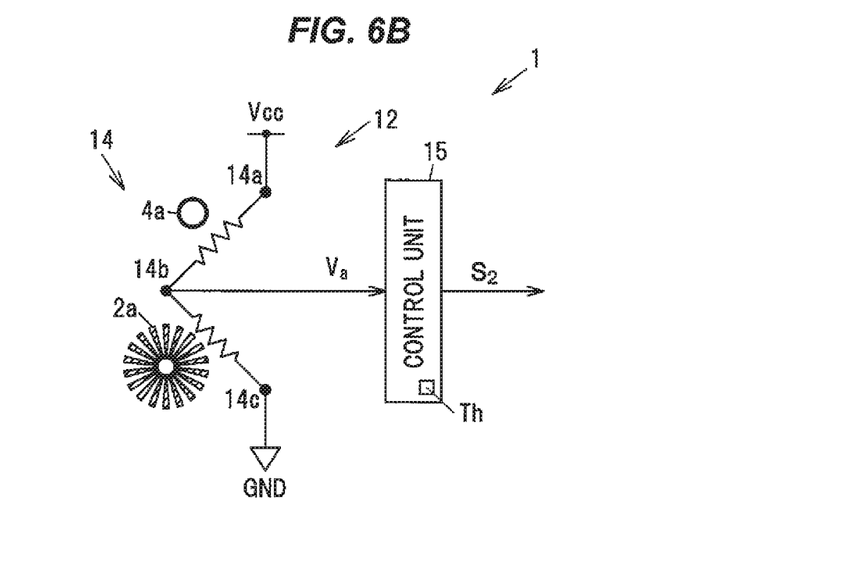
FIG. 6B is an equivalent circuit diagram illustrating the magnetic sensor in the second embodiment.

FIG. 6A is an explanatory diagram illustrating an arrangement of a radial magnetoresistance element and an annular magnetoresistance element of a magnetic sensor in the second embodiment, and FIG. 6B is an equivalent circuit diagram illustrating the magnetic sensor. In the embodiment described below, portions having the same functions and the configurations as those in the first embodiment are denoted by the same reference numerals as the first embodiment and the explanation thereof will be omitted.

The magnetic sensor 1 in the second embodiment has, e.g., a radial magnetoresistance element 2a having plural magnetic sensing parts (the first magnetic sensing parts 20) arranged radially from one point (the center P), an annular magnetoresistance element 4a arranged so as to surround the magnetoresistance element 2a, and a half-bridge circuit 14 constructed from the radial magnetoresistance element 2a and the annular magnetoresistance element 4a, as shown in FIGS. 6A and 6B.

In the second embodiment, the magnetoresistance element 4a is formed as an annular magnetoresistance element, as an example.

In this magnetic sensor 1, the magnetoresistance element 2a is formed by arranging the first magnetic sensing parts 20 at equal intervals with a rotation by 10° about the center P, as an example. Then, the magnetoresistance element 4a is formed so as to surround the magnetoresistance element 2a. The radial magnetoresistance element 2a and the annular magnetoresistance element 4a preferably have equal resistance values.

A node 14a as a connecting point between the radial magnetoresistance element 2a and the annular magnetoresistance element 4a is electrically connected to the power source voltage $V_{cc}$, as shown in FIG. 6B. A node 14c as a connecting point between the radial magnetoresistance element 2a and the annular magnetoresistance element 4a is electrically connected to the GND.

A midpoint potential $V_a$ at the node 14a between the radial magnetoresistance element 2a and the annular magnetoresistance element 4a is output from the half-bridge circuit 14. The midpoint potential $V_a$ is output to, e.g., the control unit 15.

The magnetoresistance value of the magnetoresistance element 2a and the magnetoresistance value of the magnetoresistance element 4a decreases and increases and converge to a certain resistance value as the magnet 7 moves away from the center P, in the same manner as the first embodiment.

The control unit 15 compares the midpoint potential $V_a$ with the threshold value Th and determines that the magnet 7 is located in the ON region 80, i.e., it is ON, when the midpoint potential $V_a$ is not less than the threshold value Th. Then, the control unit 15 generates the detection information $S_2$ indicating "ON" and outputs it to the connected electronic device.

Effects of the Second Embodiment

Since how the magnetoresistance value changes with respect to the direction of the magnetic field 70 is different between the radial magnetoresistance element 2a and the annular magnetoresistance element 4a, the magnetic sensor 1 in the second embodiment can easily discriminate between the action of the magnetic field 70 of the magnet 7 and the action of the disturbance magnetic field 9 and thus can be proof against the disturbance magnetic field 9, unlike when each magnetoresistance element is arranged in a rotationally symmetric manner.

Third Embodiment

The third embodiment is different from the other embodiments in having one radial magnetoresistance element and one polygonal magnetoresistance element.

Figure 7:
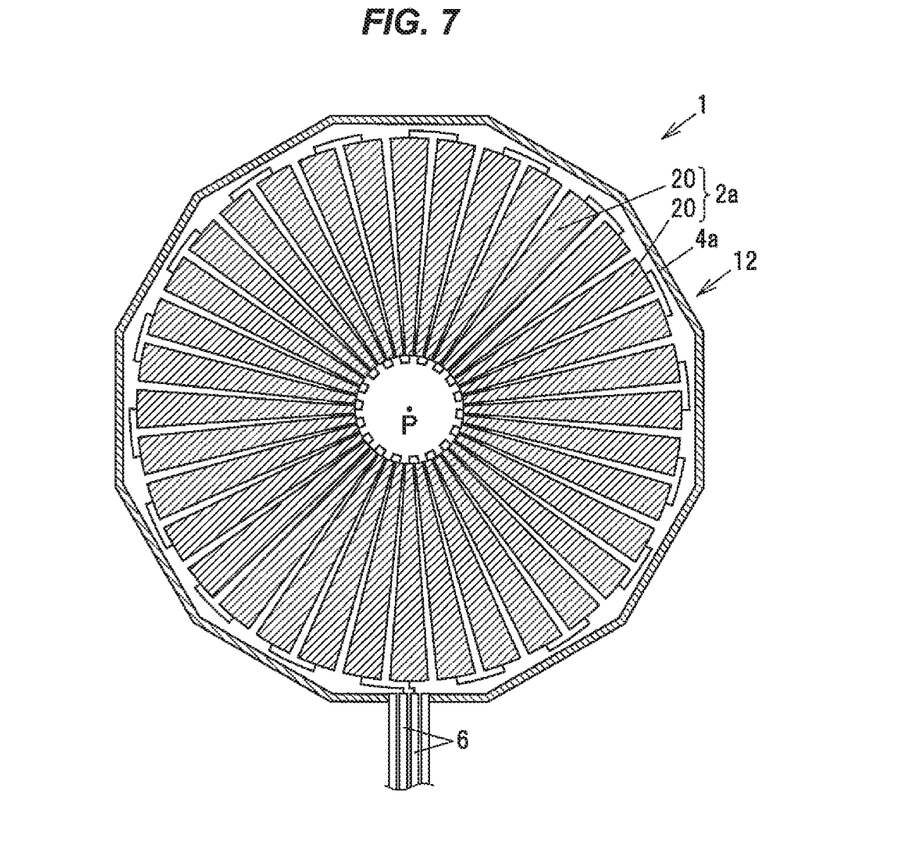
FIG. 7 is an explanatory diagram illustrating an arrangement of a radial magnetoresistance element and a polygonal magnetoresistance element of a magnetic sensor in the third embodiment.

FIG. 7 is an explanatory diagram illustrating an example of an arrangement of a radial magnetoresistance element and a polygonal magnetoresistance element of a magnetic sensor in the third embodiment.

The magnetic sensor 1 in the third embodiment has, e.g., the radial magnetoresistance element 2a having plural magnetic sensing parts (the first magnetic sensing parts 20) arranged radially from one point (the center P), and a polygonal magnetoresistance element 4b arranged so as to surround the magnetoresistance element 2a, as shown in FIG. 7.

In this magnetic sensor 1, for example, a half-bridge circuit is constructed from the radial magnetoresistance element 2a and the polygonal magnetoresistance element 4b, in the same manner as, e.g., the half-bridge circuit 14 shown in FIG. 6B. Alternatively, the magnetic sensor 1 may have a full-bridge circuit constructed from two radial magnetoresistance elements and two polygonal magnetoresistance elements as in the first embodiment.

The magnetoresistance element 4b has a regular polygonal shape with N vertices. FIG. 7 shows N=12, i.e., the magnetoresistance element 4b having a regular dodecagonal shape, as an example. When N=infinity, the magnetoresistance element 4b has approximately an annular shape. Therefore, by appropriately selecting N, it is possible to obtain the same detection results as those by the annular magnetoresistance element. The shape of the polygonal magnetoresistance element is not limited to a regular polygon as long as it is a polygonal shape with which the same detection results as those by the annular magnetoresistance element are obtained.

Although some embodiments and modifications of the invention have been described, the embodiments and modifications are merely examples and the invention according to claims is not to be limited thereto. These new embodiments and modifications may be implemented in various other forms, and various omissions, substitutions and changes, etc., can be made without departing from the gist of the invention. In addition, all combinations of the features described in the embodiments and modifications are not necessary to solve the problem of the invention. Further, these embodiments and modifications are included within the scope and gist of the invention and also within the invention described in the claims and the range of equivalency.

REFERENCE SIGNS LIST

1 MAGNETIC SENSOR
2 to 5 FIRST TO FOURTH MAGNETORESISTANCE ELEMENTS
2a MAGNETORESISTANCE ELEMENT
4a, 4b MAGNETORESISTANCE ELEMENT
6 WIRING
7 MAGNET
12 SENSOR PART
13 BRIDGE CIRCUIT
13a, 13b, 14 HALF-BRIDGE CIRCUIT
15 CONTROL UNIT
20 FIRST MAGNETIC SENSING PART
30 SECOND MAGNETIC SENSING PART
72a CENTER
80 ON REGION
81 OFF REGION

The invention claimed is:
1. A magnetic sensor, comprising:
a radial magnetoresistance element comprising a plurality of magnetic sensing parts arranged radially from one point, wherein the radial magnetoresistance element comprises a first magnetoresistance element including a plurality of first magnetic sensing parts and a second magnetoresistance element comprising a plurality of second magnetic sensing parts;
a continuous, one-piece annular or continuous, one-piece polygonal magnetoresistance element arranged so as to surround substantially all of the magnetic sensing parts of the radial magnetoresistance element; and at least one half-bridge circuit comprising the radial magnetoresistance element and the annular or polygonal magnetoresistance element.

2. The magnetic sensor according to claim 1,
wherein the annular or polygonal magnetoresistance element comprises an annular or polygonal third magnetoresistance element surrounding the first and second magnetoresistance elements and an annular or polygonal fourth magnetoresistance element surrounding the third magnetoresistance element, and
wherein two half-bridge circuits comprising the first to fourth magnetoresistance elements are installed in the magnetic sensor.

3. The magnetic sensor according to claim 2, wherein the first magnetic sensing parts and the second magnetic sensing parts have a circular-sector shape obtained by dividing a circle centered at the one point.

4. The magnetic sensor according to claim 2, wherein the first magnetic sensing parts and the second magnetic sensing parts are alternately arranged in a circumferential direction.

5. The magnetic sensor according to claim 2, wherein the first magnetic sensing parts and the second magnetic sensing parts are arranged in a rotationally symmetric manner about the center.

6. The magnetic sensor according to claim 2, wherein the first to fourth magnetoresistance elements have equal resistance values including resistance components that do not change even under action of a magnetic vector and magnetoresistance components that change under the action of the magnetic vector.

7. The magnetic sensor according to claim 2, wherein the first magnetoresistance element or the second magnetoresistance element and the third magnetoresistance element or the fourth magnetoresistance element are electrically connected and output a first midpoint potential, and the remaining magnetoresistance elements are electrically connected and output a second midpoint potential.

8. The magnetic sensor according to claim 2, wherein the first to fourth magnetoresistance elements comprise thin alloy films that comprise mainly a ferromagnetic metal comprising Ni or Fe.

9. The magnetic sensor according to claim 2, further comprising:
an op-amp that outputs an output signal obtained by differentially amplifying the first midpoint potential and the second midpoint potential; and
a control unit that compares the output signal output from the op-amp with a threshold value and determines whether or not a magnet approaches.

10. The magnetic sensor according to claim 9, wherein the control unit determines that the magnet is located in a region from the center to an outer periphery of the fourth magnetoresistance element when the output signal is not less than the threshold value, and that the magnet is located in a region outside the outer periphery of the fourth magnetoresistance element when the output signal is less than the threshold value.

* * * * *